United States Patent
Confalonieri et al.

(10) Patent No.: US 9,852,781 B2
(45) Date of Patent: Dec. 26, 2017

(54) DYNAMICALLY ALLOCABLE REGIONS IN NON-VOLATILE MEMORIES

(75) Inventors: Emanuele Confalonieri, Lesmo (IT); Giuseppe Russo, Durazzano (IT); Luca Porzio, Casalnuovo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 747 days.

(21) Appl. No.: 12/703,626

(22) Filed: Feb. 10, 2010

(65) Prior Publication Data

US 2010/0202194 A1    Aug. 12, 2010

(30) Foreign Application Priority Data

Feb. 11, 2009   (IT) .............................. MI2009A0175

(51) Int. Cl.
  *G11C 11/00*   (2006.01)
  *G11C 8/12*    (2006.01)
  *G11C 13/00*   (2006.01)

(52) U.S. Cl.
  CPC ............ *G11C 8/12* (2013.01); *G11C 13/0004* (2013.01); *G11C 13/0064* (2013.01); *G11C 13/0069* (2013.01)

(58) Field of Classification Search
  CPC ... G11C 8/12; G11C 13/0004; G11C 13/0069; G11C 13/0064
  USPC ......... 365/185.11, 148, 163, 185.08, 185.22, 365/230.03, 189.08, 175, 185.29, 185.33, 365/154, 210.1; 711/113; 714/721
  See application file for complete search history.

(56) References Cited

U.S. PATENT DOCUMENTS

| | | | | |
|---|---|---|---|---|
| 5,615,148 A | * | 3/1997 | Yamamura et al. | 365/185.11 |
| 5,650,961 A | * | 7/1997 | Himeno et al. | 365/185.11 |
| 5,715,423 A | | 2/1998 | Levy | |
| 5,774,396 A | * | 6/1998 | Lee et al. | 365/185.11 |
| 5,828,621 A | * | 10/1998 | Tanzawa et al. | 365/185.11 |
| 5,847,995 A | * | 12/1998 | Kobayashi et al. | 365/185.11 |
| 5,963,477 A | * | 10/1999 | Hung | 365/185.11 |
| 5,978,263 A | * | 11/1999 | Javanifard et al. | 365/185.11 |
| 5,982,661 A | * | 11/1999 | Kawamata | 365/185.11 |

(Continued)

FOREIGN PATENT DOCUMENTS

| | | |
|---|---|---|
| EP | 0741387 | 6/1996 |
| WO | 0017886 | 3/2000 |

OTHER PUBLICATIONS

Search Report based on the Italian Application Serial No. MI20090175, Ministero dello Sviluppo Economico, Minich Apr. 22, 2010; pp. 3.

*Primary Examiner* — Connie Yoha
(74) *Attorney, Agent, or Firm* — Seed IP Law Group LLP

(57) ABSTRACT

An embodiment of a non-volatile memory device is proposed. Said memory device comprises a matrix of memory cells; each memory cell is individually programmable to at least a first logic level and individually erasable to a second logic level. The memory device further comprises partition means for logically subdividing the matrix into a plurality of subspaces; each subspace comprises at least one respective memory cell. The memory device further comprises selection means for selecting a subspace, operative means for performing an operation on all the memory cells of the selected subspace, and means for dynamically modifying the number of subspaces and/or the number of memory cells included in each subspace.

28 Claims, 4 Drawing Sheets

(56) References Cited

U.S. PATENT DOCUMENTS

| | | | | |
|---|---|---|---|---|
| 6,563,734 B2* | | 5/2003 | Taki | 365/185.11 |
| 6,643,175 B2* | | 11/2003 | Yamauchi et al. | 365/185.11 |
| 6,646,920 B2* | | 11/2003 | Takashina et al. | 365/185.11 |
| 6,671,710 B2* | | 12/2003 | Ovshinsky et al. | 365/163 |
| 6,781,878 B2* | | 8/2004 | Kleveland et al. | 365/185.11 |
| 7,313,022 B2* | | 12/2007 | Takeuchi et al. | 365/185.11 |
| 7,408,801 B2* | | 8/2008 | Kang et al. | 365/154 |
| 7,426,141 B2* | | 9/2008 | Takeuchi | 365/185.11 |
| 7,619,921 B2* | | 11/2009 | Hosono et al. | 365/185.11 |
| 7,630,263 B2* | | 12/2009 | Pio | 365/210.1 |
| 7,649,775 B2* | | 1/2010 | Kim et al. | 365/185.11 |
| 7,681,009 B2* | | 3/2010 | Adatrao et al. | 365/185.33 |
| 7,787,291 B2* | | 8/2010 | Resta et al. | 365/163 |
| 7,788,553 B2* | | 8/2010 | Chow et al. | 365/185.33 |
| 7,937,526 B1* | | 5/2011 | Sutardja | 711/113 |
| 7,945,825 B2* | | 5/2011 | Cohen et al. | 714/721 |
| 8,040,744 B2* | | 10/2011 | Gorobets et al. | 365/185.11 |
| 8,085,584 B1* | | 12/2011 | Kale et al. | 365/163 |
| 8,094,500 B2* | | 1/2012 | Paley et al. | 365/185.11 |
| 8,120,990 B2* | | 2/2012 | Kim | 365/185.11 |
| 8,194,452 B2* | | 6/2012 | Rao | 365/185.08 |
| 8,244,959 B2* | | 8/2012 | Fusella et al. | 365/185.29 |
| 8,301,828 B2* | | 10/2012 | Miller | 365/185.33 |
| 9,727,239 B2* | | 8/2017 | Niu | G06F 3/06 |
| 2007/0124531 A1 | | 5/2007 | Nishihara | |
| 2009/0235015 A1* | | 9/2009 | Hatsuda | G06F 12/0866 711/103 |
| 2009/0259799 A1* | | 10/2009 | Wong | G06F 12/0207 711/103 |

* cited by examiner

DYNAMICALLY ALLOCABLE REGIONS IN NON-VOLATILE MEMORIES

PRIORITY CLAIM

The present application claims priority to Italian Patent Application No. MI2009A000175, filed Feb. 11, 2009, which application is incorporated herein by reference in its entirety.

TECHNICAL FIELD

An embodiment of the present disclosure refers to memory devices, and particularly to a non-volatile memory device.

BACKGROUND

A non-volatile memory device is a type of memory capable of retaining the stored information even in absence of electrical supply. Among the non-volatile memories presently available in the market, one of the most widespread is the flash memory.

A flash memory device is integrated in a semiconductor chip and includes one or more blocks, each one formed in a respective insulated well (body). Each block comprises a matrix of memory cells having a plurality of rows and columns; the memory cells of each row are coupled to a respective row line, while the memory cells of each column are coupled to a respective bit line. Typically, each memory cell includes a floating gate MOS transistor, insulated by means of a thin oxide layer.

An unprogrammed transistor has a reduced threshold voltage; therefore, when the transistor is selected, current flows through the respective bit line (corresponding to a logic value 1). The transistor is programmed by injecting an electrical charge into its floating gate. In this condition, the transistor has a high threshold voltage; therefore, when the transistor is selected, little or no current flows through the respective bit line (corresponding to a logic value 0).

A drawback of the flash memories is that the programmed memory cells cannot be individually erased (i.e., brought to the logic value 1), but is erased by blocks. Particularly, in an erasing operation, the body wherein such block is formed is biased in such a way to remove the electric charge included in the floating gates of the programmed memory cells.

The smallest practical block size that may be implemented at a reasonable cost amounts to few Kilobytes. In any case, the resolution obtained in this way is insufficient for those applications that require the modifying of information at the level of a single word, byte, or even bit.

Other than the standard reading, writing and erasing operations, a flash memory device may be capable of managing more complex operations. For example, U.S. Pat. No. 5,715,423, which is incorporated by reference, discloses a flash memory device capable of executing an internal copying operation, by means of which the information stored in a first group of memory cells may be copied into a second group of cells of the same memory without having to involve any external device. However, even an operation of such type may be hindered by the low resolution that is typical of flash memories; indeed, the content of the memory cells of the second group are made equal to the logic value 1 before the copying operation; otherwise the memory cells of such group would have to be first erased, which would involve all the memory cells of the block in which the second group is located.

An embodiment of the present disclosure overcomes the drawbacks previously cited.

SUMMARY

An embodiment of a non-volatile memory device is proposed. Said memory device comprises a matrix of memory cells; each memory cell is individually programmable to at least a first logic level and individually erasable to a second logic level. The memory device further comprises partition means for logically subdividing the matrix into a plurality of subspaces; each subspace comprises at least one respective memory cell. The memory device further comprises selection means for selecting a subspace, operative means for performing an operation on all the memory cells of the selected subspace, and means for dynamically modifying the number of subspaces and/or the number of memory cells included in each subspace.

A further embodiment is a corresponding method for operating a non-volatile memory device.

BRIEF DESCRIPTION OF THE DRAWINGS

One or more embodiments of the disclosure, as well as further features and respective advantages, will be better understood making reference to the following detailed description, given purely by way of an indicative and non-restrictive indication, to be read in conjunction with the attached figures. In this regard, it is expressly intended that the figures are simply intended to conceptually illustrate the described structures and procedures. In particular.

DETAILED DESCRIPTION

In the following description, identical or similar elements depicted in different figures are identified with the same references.

Figure 1:
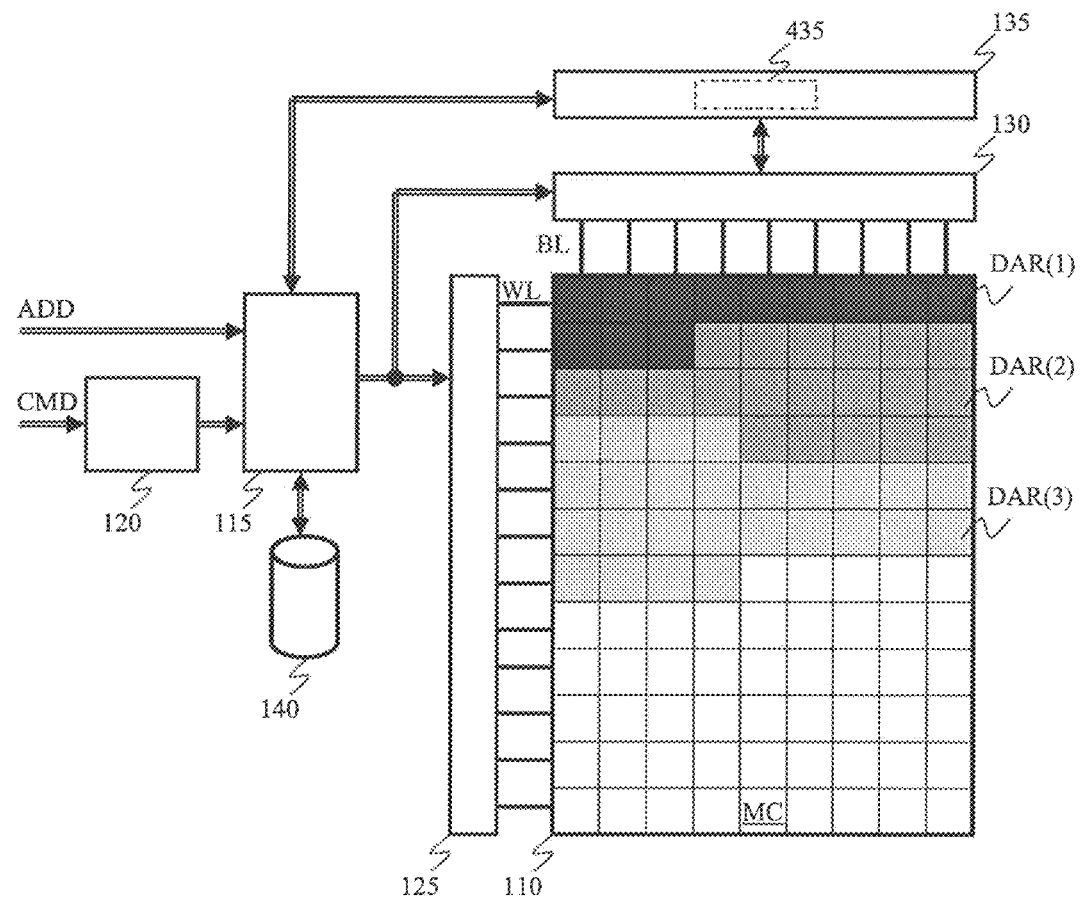
FIG. 1 illustrates a non-volatile memory according to an embodiment of the present disclosure.

FIG. 1 schematically illustrates a non-volatile memory 100 in which an embodiment of the present disclosure may be applied.

The memory 100 includes a memory matrix 110 comprising a plurality of memory cells MC arranged in row and columns. The memory 100 includes a plurality of bit lines BL, each associated with a respective column of the memory matrix 110, and a plurality of word lines WL, each associated with a respective row of the memory matrix 110.

The memory 100 further includes a main control circuit 115 that manages operation to be executed on the memory cells MC in response to commands CMD and an address ADD received from the outside of the memory 100. For this purpose, the main control circuit 115 is coupled to a command interface 120 adapted to receive the commands CMD for determining the specific operation to be executed on the memory cells MC identified by the received address ADD.

In response to the received address ADD, the main control circuit 115 drives a row decoder 125 and a column decoder 130, which select at least one word line WL and a group of bit lines BL, respectively.

Moreover, the main control circuit 115 is adapted to drive a read/write circuit 135 based on the command CMD interpreted by the command interface 120. The read/write circuit 135 includes all the components (such as sense amplifiers, registers, comparators, charge pumps, reference cells, impulse generators and so on) which are used for programming the memory cells MC corresponding to the selected word lines WL and bit lines BL, or for reading the data stored thereinto.

According to an embodiment of the present disclosure, the memory 100 is a non-volatile memory having a high resolution, wherein each single memory cell MC may be programmed or erased independently from the other memory cells MC of the memory matrix 110. Examples of non-volatile memories provided with such a feature include the $E^2PROM$ memories, the ovonic memories, and the ferromagnetic memories, to cite few of the most widespread.

Making reference in particular to an ovonic memory, each memory cell MC is made of a phase-change material; typically, the phase-change material includes a calcogenide (such as an alloy $Ge_2Sb_2Te_5$). The phase-change material may be reversibly switched between a generally amorphous, disordered phase and a generally crystalline, high ordered phase. The two phases of the material exhibit different electrical characteristics; particularly, the material in the amorphous phase has a high resistivity (defining a reset state associated with a first logic value, for example, 0), whereas the material in the crystalline phase has a low resistivity (defining a set state associated with a second logic value, for example, 1). But the present disclosure is not limited to the application field of the phase-change memories, since the disclosed concepts may be applied to the other types of memory provided with the possibility of programming and erasing the memory cells one by one, such as the ferromagnetic memories.

According to an embodiment of the present disclosure, the possibility of individually programming (to the logic level 1) and erasing (to the logic level 0) the memory cells MC is advantageously exploited for subdividing the memory space of the memory matrix 110 into distinct subspaces which are dynamically allocable. Each subspace, denoted with the term "dynamic region" and identified with the reference DAR(i), is formed by a number of adjacent memory cells in the memory matrix 110, i.e., corresponding to consecutive addresses ADD. A generic dynamic region DAR(i) may be identified in different ways, for example by means of the address ADD corresponding to the first and the last memory cell MC included in such dynamic region DAR(i), or by means of the address ADD of the first memory cell MC and the number of memory cells MC that form such dynamic region DAR(i). Alternatively, since modern electronic memories—such as the non-volatile memory 100—are usually capable of accessing in parallel more than one memory cell MC at a time, e.g., for reading a string of values (word) stored in a group of memory cells MC corresponding to a given word line WL and a set of bit lines BL, the generic dynamic region DAR(i) may be identified by means of the addresses ADD corresponding to the first and the last word included in such dynamic region DAR(i), or by means of the address ADD of the first word and the number of words that form such dynamic region DAR(i).

According to an embodiment of the present disclosure, the dynamic regions DAR(i) may be directly defined by the user or in an automatic way, in both cases by means of the main control circuit 115.

Particularly, the memory 100 is provided with an allocation register—identified in FIG. 1 with the reference 140—adapted to memorize the information necessary for the definition of each dynamic region DAR(i); for example, the allocation register 140 may memorize for each dynamic region DAR(i) the addresses ADD corresponding to the first and last memory cell MC (or word) and the number of memory cells MC (words) forming such dynamic region DAR(i). As a consequence, for modifying the position of a dynamic region DAR(i) in the memory space defined by the memory matrix 110 and/or modifying the size thereof, it is sufficient to modify the information regarding such region in the allocation register 140, for example by sending proper commands CMD and addresses ADD to the command interface 120 and to the main control circuit 115 by the user, or in a way that is transparent to the user, being automatically managed by the main control circuit 115.

Instead of the presence of a dedicated allocation register 140, an embodiment is also applicable to the case in which the information required for the definition of each dynamic region DAR(i) are memorized in a portion of the memory matrix 110 itself.

The presence of the dynamic regions DAR(i) may be advantageously exploited by defining specific operations adapted to be executed on such dynamic region DAR(i); as will be more clear in the following description, through such operations it is possible to drastically increase the flexibility of use of the memory 100 with respect to a flash memory, which has the constraint of being erased in memory cells blocks of predetermined size.

A first proposed operation according to an embodiment of the present disclosure regards the possibility of programming all the memory cells MC (words) of a generic dynamic region DAR(i) to a same logic level (0 or 1).

Figure 2:
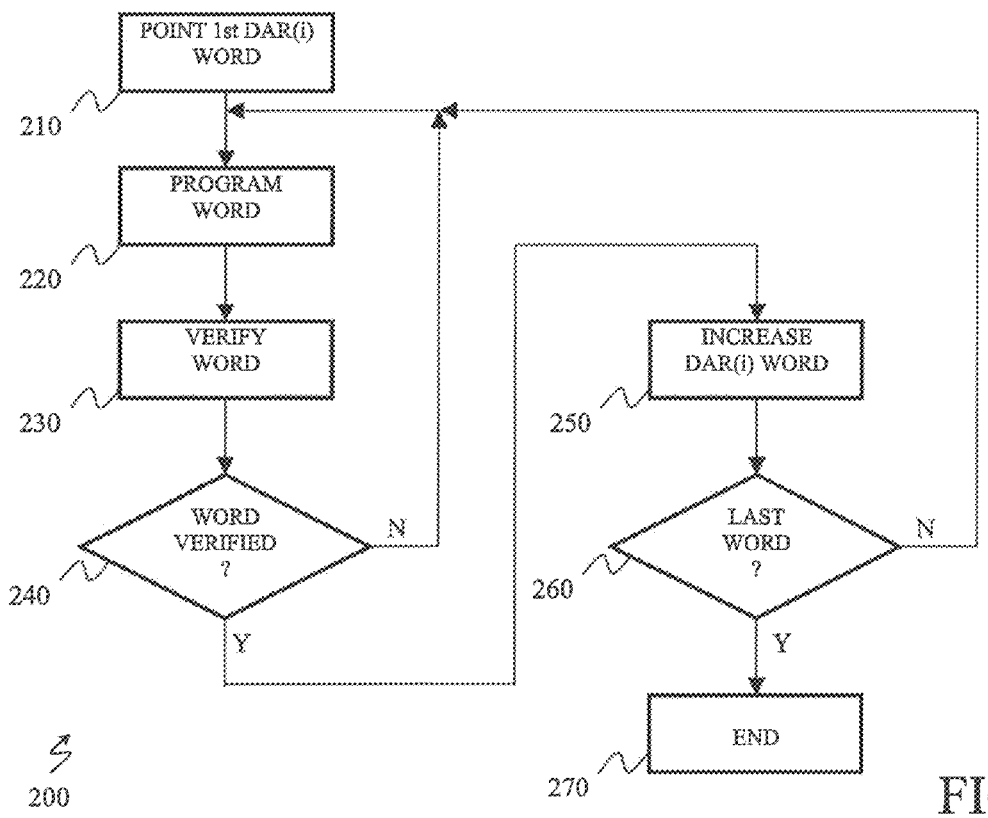
FIG. 2 illustrates a flux diagram showing the main phases carried out by the memory of FIG. 1 during the execution of a programming operation according to an embodiment of the present disclosure.

FIG. 2 illustrates a flow diagram 200 that shows the main steps carried out by the main control circuit 115 during the execution of a programming operation of such type on the words that forms a dynamic region DAR(i) according to an embodiment of the present disclosure.

Firstly, the main control circuit 115 drives the row decoder 125 and the column decoder 130 with the address ADD corresponding to the first word of the dynamic region DAR(i) to be programmed (block 210); as already described above, the address ADD of the first word of such dynamic region DAR(i) is memorized in the memory 100, for example in the allocation register 140.

At this point (block 220), the main control circuit 115 drives the read/write circuit 135 in such a way that all the memory cells MC of the word selected by the row decoder 125 and by the column decoder 130 are programmed to a same logic value (0 or 1); particularly, the read/write circuit 135 provides to the memory cells MC of the selected word program pulses having a duration and an intensity depending on the logic level to which such memory cells MC are to be programmed.

The memory cells MC programmed in this way are subsequently subjected to a verifying operation (block 230), for assessing if the programming has been correctly accomplished or not. The verifying operation includes a reading of the logic value of the memory cells MC followed by a comparison operation of the various logic values with the desired ones.

In case the verification has given a negative result (exit branch N of the block 240), the memory cells MC of the words are subjected to a further programming (block 220); in case such verification has instead given a positive result (exit branch Y of the block 240), the main control circuit 115 drives the row decoder 125 and the column decoder 130 with a new address ADD.

If the process technology used for manufacturing the memory cells MC is sufficiently mature to guarantee a very reliable programming, i.e., characterized by a sufficiently reduced programming error probability, the execution speed of the operation could be increased by omitting the verification executed in the block 230.

Particularly, the main control circuit 115 increases the address ADD previously used in such a way to select the next word of the dynamic region DAR(i) (block 250).

If such address ADD exceeds the address ADD corresponding to the last word of the dynamic region DAR(i) (exit branch Y of the block 260), it means that all the words of such dynamic region DAR(i) have been programmed, and therefore that the operation is finished (block 270). If instead the address ADD does not exceed the address ADD corresponding to the last word of the dynamic region DAR(i) (exit branch N of the block 260), the operations previously described are repeated on the new selected memory cells MC (return to block 220). As previously described, even the address ADD of the last word of the dynamic region DAR(i) may be memorized in the memory 100, for example in the allocation region 140. Alternatively, in case each dynamic region DAR(i) is identified by means of the address ADD of the first word and the number of words that form such region, the control performed at the block 260 may be substituted with a control on the number of words actually programmed.

By means of the programming operation described in FIG. 2, it is possible to program all the memory cells MC of a generic dynamic region DAR(i) to a same desired logic level, such as the logic level 1 associated with the reset state. Unlike the flash memories, wherein for erasing a group of memory cells and bringing them to the reset state it is necessary to perform an erasing operation that involves a whole block (having predetermined size) of memory cells, by means of the previously described operation, in order to erase the memory cells MC of a dynamic region DAR(i) it is not necessary to involve any additional memory cell. In other words, according to an embodiment of the present disclosure, the dynamic regions DAR(i) behave as the blocks of the flash memories, but—unlike the latter—the dynamic regions DAR(i) may be allocated in a dynamic way, and thus may be modified, for example, in size. Thanks to said feature, it is possible to perform an erasing operation (i.e., bringing to the logic level associated with the reset state) on the interested memory cells MC, increasing the efficiency of the memory 100.

A further proposed operation according to an embodiment of the present disclosure regards the possibility of verifying whether all the memory cells MC (words) of a generic dynamic region DAR(i) are at a same level (0 or 1) or not.

Figure 3:
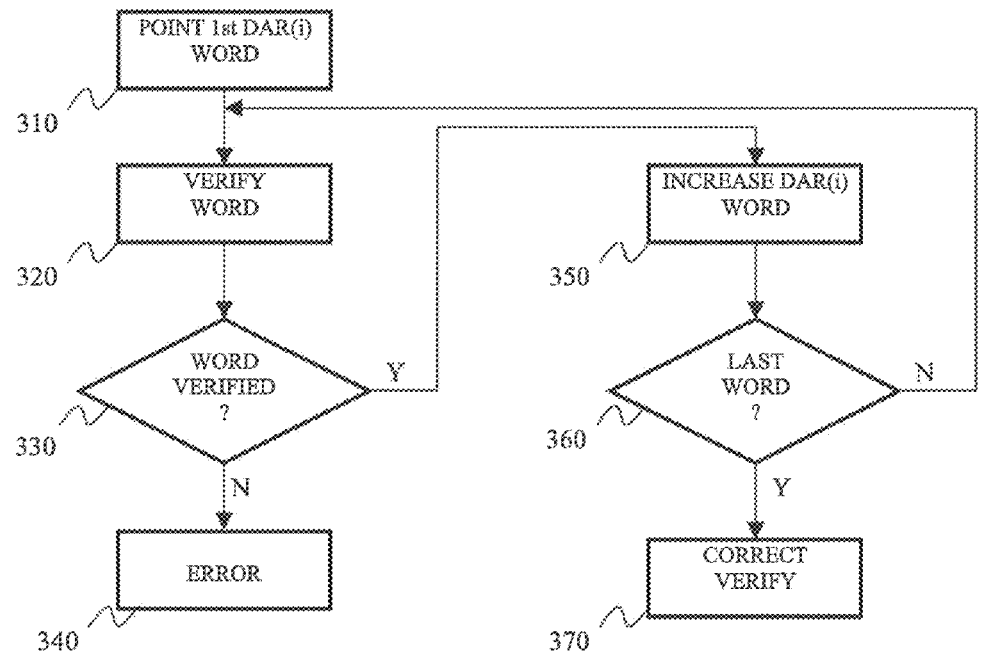
FIG. 3 illustrates a flux diagram, showing the main phases carried out by the memory of FIG. 1 during the execution of a verifying operation according to an embodiment of the present disclosure.

FIG. 3 illustrates a flow diagram 300 showing the main steps carried out by the main control circuit 115 during the execution of a verifying operation of such type on the words forming a dynamic region DAR(i) according to an embodiment of the present disclosure.

The main control circuit 115 drives the row decoder 125 and the row decoder 130 with the address ADD corresponding to the first word of the dynamic region DAR(i) to be programmed (block 310).

Subsequently (block 320), the main control circuit 115 drives the read/write circuit 135 in such a way that the memory cells MC of the words selected by the row decoder 125 and by the column decoder 130 are subjected to a verifying operation, for assessing whether the logic level assumed by all the memory cells MC of the word is equal or not to a desired value (for example, 0). Such verifying operation includes a reading of the logic values of the memory cells MC followed by an operation for comparing such logic values with the desired one.

In case the verification has given a negative result (exit branch N of the block 330), i.e., if at least one among the memory cells MC of the word has been verified as programmed to a logic level different than the desired one, the main control circuit 115 interrupts the operation and provides the result of the verification, for example, by asserting an error flag (block 340).

In case the verification has given a positive result (exit branch Y of the block 330), the main control circuit 115 drives the row decoder 125 and the row decoder 130 with a new address ADD.

Particularly, the main control circuit 115 increases the address ADD previously used in such a way to select the memory cells MC of the next word of the dynamic region DAR(i) (block 350).

If such address ADD exceeds the address ADD corresponding to the last word of the dynamic region DAR(i) (exit branch Y of the block 360), it means that the memory cells MC of all the words of such dynamic region DAR(i) have been verified as programmed to the desired logic level; in this case, the main control circuit 115 interrupts the operation and provides the result of the verification, for example, by asserting a correct verification flag (block 370). If instead the address ADD does not exceed the address ADD corresponding to the last word of the dynamic region DAR(i) (exit branch N of the block 360), the operations previously described are repeated on the new selected memory cells MC (return to block 320).

A further operation proposed according to an embodiment of the present disclosure regards the possibility of copying the content of all the memory cells MC of a generic dynamic region DAR(i) into the memory cells MC of a different dynamic region DAR(j). As will be more clear in the following, according to an embodiment of the present disclosure, the copying operation of the content of the memory cells MC belonging to a dynamic region DAR(i) into the memory cells of another region DAR(j) is carried out by temporarily memorizing portions of the first dynamic region DAR(i) into a backup register, and copying such memorized portions into the memory cells of the second dynamic region DAR(j). Each one of such portions may in general correspond to the memory cells MC of more than one word.

Figure 4A:
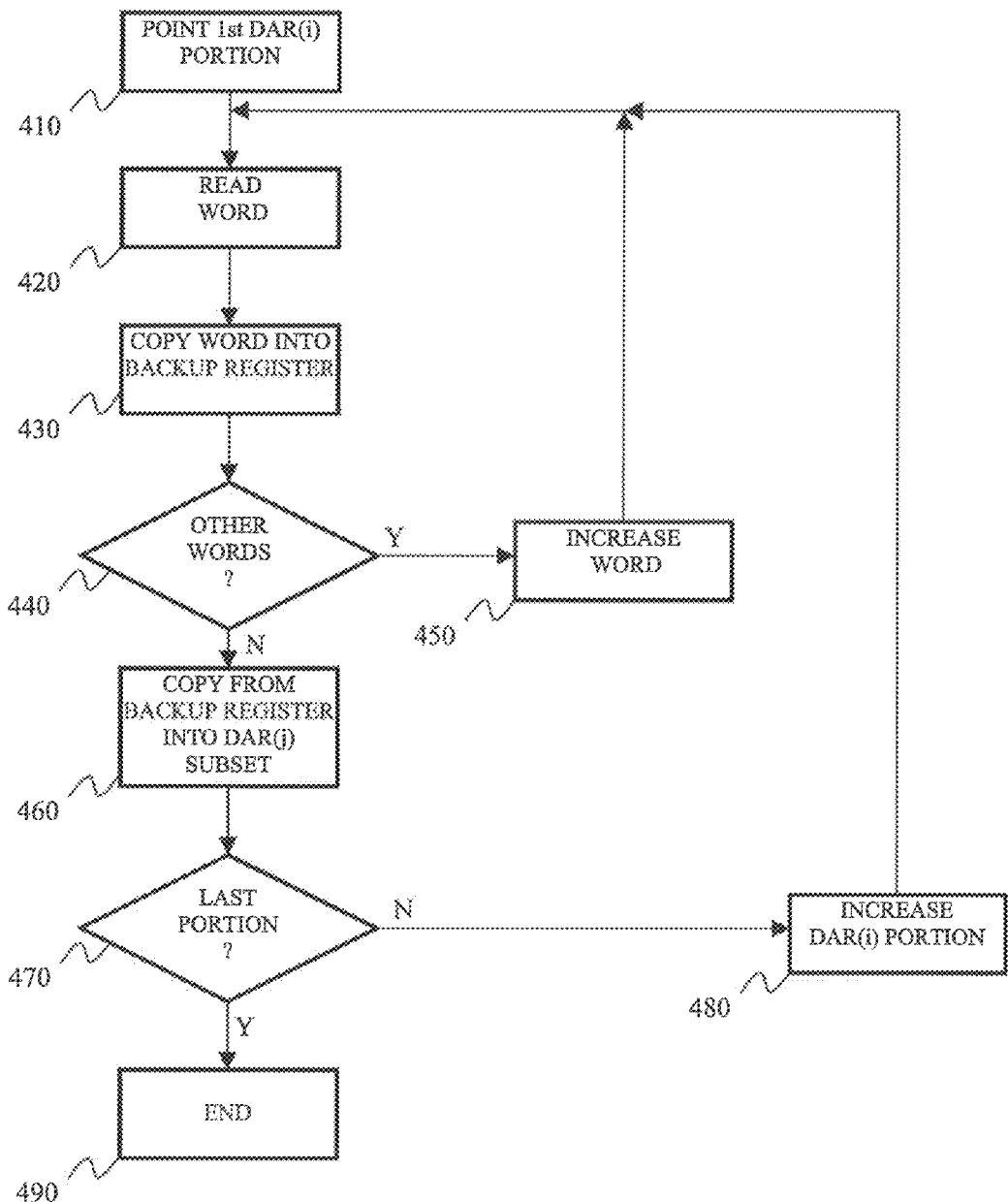
FIGS. 4A and 4B illustrate flux diagrams showing the main phases carried out by the memory of FIG. 1 during the execution of a copying operation according to an embodiment of the present disclosure.

Particularly, in FIG. 4A is illustrated a flow diagram 400 that shows in greater detail the main steps performed by the main control circuit 115 during the execution of such operation according to an embodiment of the present disclosure.

Firstly, the main control circuit 115 drives the row decoder 125 and the column decoder 130 with the address ADD corresponding to the first word of a first selected portion of the dynamic region DAR(i) (block 410).

At this point (block 420), the main control circuit 115 drives the read/write circuit 135 for reading the logic values of the memory cells MC of the word identified by the address ADD.

The logic values of such word are thus memorized into a backup register (block 430), such as one of the registers included in the read/write circuit 135—identified in FIG. 1 with the reference 435.

Subsequently, the main control circuit 115 verifies whether in the selected portion of the dynamic region DAR(i) there are still words to be copied into the backup register 435 or not.

In the affirmative case (exit branch Y of the block 440), the main control circuit 115 drives the row decoder 125 and the column decoder 130 with a new address ADD. Particularly, the main control circuit 115 increases the address ADD previously used in such a way to select the next word of the selected portion of the dynamic region DAR(i) (block 450), and executing the operations previously described (return to block 420).

In the negative case (exit branch N of the block 440), i.e., if the whole selected portion of the dynamic region DAR(i) is memorized in the backup register 435, the content of such register is copied into the memory cells MC of a corresponding portion of the dynamic region DAR(j) (block 460).

The main control circuit 115 performs a further control, for verifying whether all the portions of the dynamic region DAR(i) have been copied or if some portions thereof have to be still copied. In case it is necessary to copy a further portion of the dynamic region DAR(i) (exit branch N of the block 470), the main control circuit 115 drives the row decoder 125 and the column decoder 130 with a new address ADD; particularly, the main control circuit 115 increases the address ADD previously used in such a way to select the first word of the next portion of the dynamic region DAR(i) (block 480), and execute the operations previously described (return to block 420). If instead also the last portion of the dynamic region DAR(i) has been copied (exit branch Y of the block 470), it means that the content of all the memory cells MC forming the dynamic region DAR(i) has been copied into memory cells MC corresponding to the dynamic region DAR(j), and that the operation is concluded (block 490).

Figure 4B:
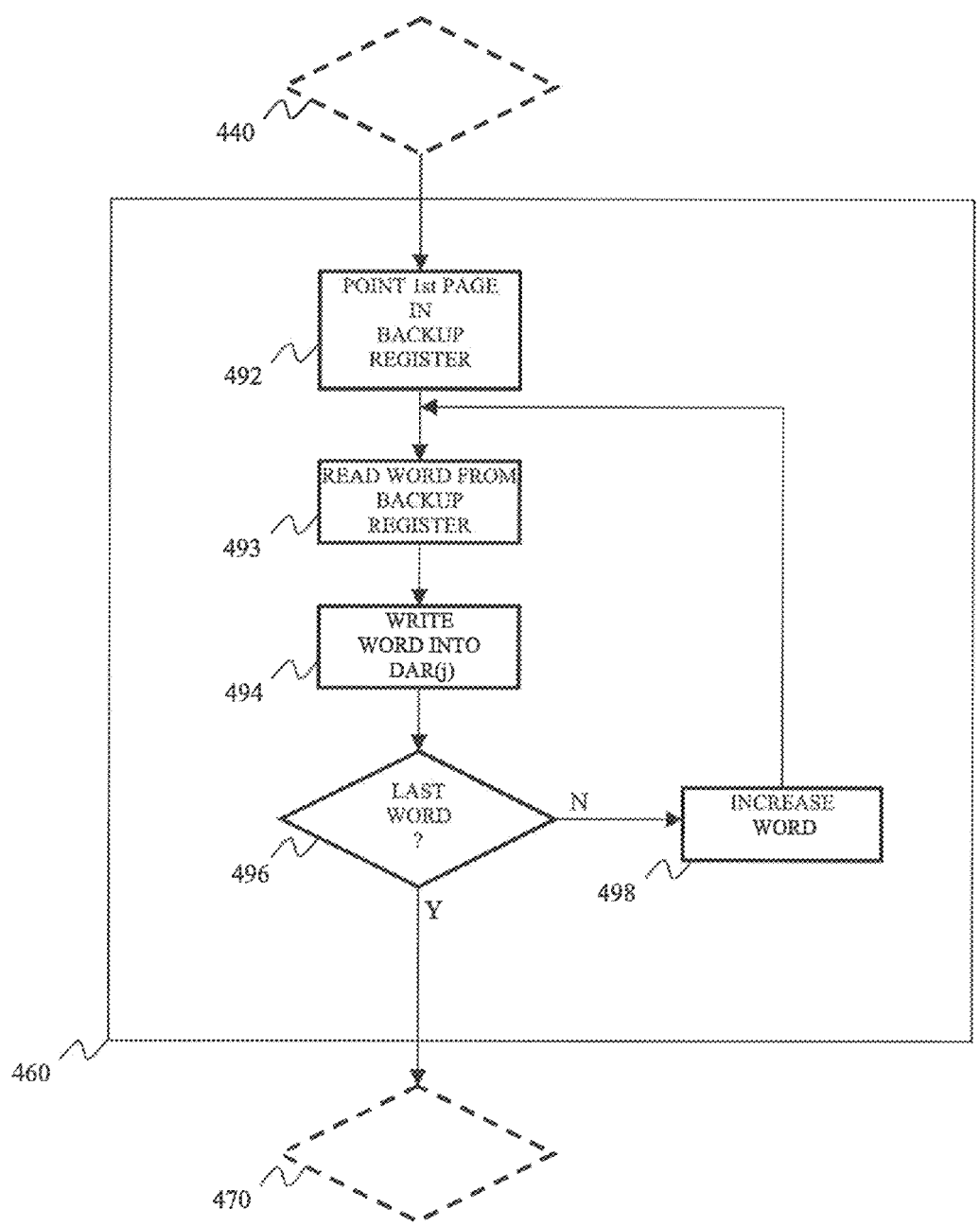

The step corresponding to the block 460, i.e., the copying operation of the content of the backup register 435 into the memory cells MC of a corresponding portion of the dynamic region DAR(j), is illustrated in greater detail in the flow diagram shown in FIG. 4B.

Particularly, the main control circuit 115 drives the read/write circuit 135 for selecting the first page memorized in the backup register 435 (block 492). Subsequently, the selected word is read (block 493) and copied into the memory cells MC corresponding to a portion of the dynamic region DAR(j) (block 494). If the backup register stores words that have not been still copied (exit branch N of the block 496), the main control circuit 115 drives the read/write circuit 135 for selecting the next page memorized in the backup register 435 (block 498), and repeating the operations previously described using the new selected page (return to block 493). When all the words memorized in the backup register 435 have been copied (exit branch Y of the block 496), it means that the portion of the dynamic region DAR(i) has been fully copied into a respective portion of the dynamic region DAR(j).

The operations described in the flow diagrams illustrated in the FIGS. 2, 3, 4A and 4B may be performed by the main control circuit 115 by means of the execution of a program in form of firmware or micro-code; such program may be, for example, memorized in a dedicated ROM memory (not shown) included in the memory 100, and coupled with the main control circuit 115.

Thanks to the presence of the dynamic regions DAR(i) and thanks to the operations that exploit them, the proposed memory 100 may be more efficient than a memory of the flash type for different point of views. However, the proposed memory 100 may also be advantageously exploited for simulating the operative functioning of a flash memory, for example for the retrofit of more complex electronic systems including one or more flash memory modules.

As described above, in a flash memory it is not possible to singularly erase the memory cells. Making reference to the case of a standard memory flash, wherein the erased memory cells correspond to the logic level 1 and the programmed memory cells correspond to the logic level 0, when a word of data comprising both bits equal to 1 and bits equal to 0 is in a group of memory cells, the memory cells of the group that are subjected to the programming operations are the cells corresponding to the word's bits equal to 0. In other words, the bits of the word having a value equal to 1 "mask" the programming operation, leaving unaltered the logic levels of the corresponding memory cells. The programming may be carried out by means of a first modality, denoted in jargon with the term "word programming", by means of which the words are programmed one at a time, or by means of a second modality, denoted in jargon with the term "buffer programming", by means of which more words are programmed in parallel. Such programming method may be easily implemented in the memory 100, because of the great reliability offered by an embodiment. Moreover, thanks to the possibility of singularly programming the memory cells both at the logic level 0 and at the logic level 1, it is possible to implement the dual operation with the proposed memory 100, using the bits of the word to be written having the value 0 for masking the programming, and modifying the logic level of the memory cells corresponding to the bits of the word having the value 1.

Naturally, in order to satisfy local and specific requirements, one may apply to the above description many modifications. More specifically, although the present disclosure has been described with a certain degree of particularity with reference to preferred embodiments have been described, it should be understood that various omissions, substitutions and changes in the form and details as well as other embodiments are possible. Moreover, it is expressly intended that specific elements and/or method steps described in connection with any disclosed embodiment of the disclosure may be incorporated in any other embodiment as a matter of general design choice.

For example, although in the present description reference has been made to two-level memory cells, i.e., capable of assuming two distinct logic levels (1 and 0), the concepts of the disclosure are applicable to multi-level memories, wherein the memory cells may be programmed in such a way to assume a higher number of distinct logic levels.

Furthermore, the memory 100 may be coupled to one or more other integrated circuits (ICs), such as a controller, to form a system. The memory 100 and one or more other ICs may be disposed on the same or on different dies.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A non-volatile memory device, said memory device including:

a matrix of memory cells, each memory cell being individually programmable to at least one first logic level and individually erasable to a second logic level;

a partition circuit for logically subdividing the matrix into a plurality of subspaces, each subspace comprising at least one respective memory cell;

a selection circuit for selecting a subspace;

an operative circuit for performing an operation on all the memory cells of the selected subspace, the operation including a verify operation, said verify operation being adapted to verify whether all the memory cells of the selected subspace are to a same selected logic value; and a circuit for dynamically modifying the number of memory cells included in each subspace.

2. The memory device of claim 1, wherein the operation performed by the operative circuit comprises a program operation on all the memory cells of the selected subspace to the same selected logic level.

3. The memory device of claim 1, wherein the operation performed by the operative circuit comprises a copy operation of logic levels corresponding to the memory cells of the selected subspace into the memory cells of a further selected subspace.

4. The memory device of claim 1, wherein the memory cells are phase-change memory cells.

5. A method, comprising:
operating a non-volatile memory device comprising a matrix of memory cells, each memory cell being individually programmable to at least one first logic level and individually erasable to a second logic level;
logically subdividing the matrix into a plurality of subspaces, each subspace comprising at least one respective memory cell;
selecting a subspace;
performing an operation on all the memory cells of the selected subspace;
dynamically modifying the number of memory cells included in each subspace; and
wherein said operation comprises verifying whether all the memory cells of the selected subspace are to a same selected logic level.

6. The method of claim 5, wherein said operation comprises programming the memory cells of the selected subspace to the same selected logic level.

7. The method of claim 6, wherein said programming the memory cells of the selected subspace comprises selecting a group of memory cells of the selected subspace, and repeating the steps of:
programming the memory cells of the selected group of memory cells to the selected logic level;
verifying the selected logic level corresponding to the selected group of memory cells; and
selecting a further group of memory cells of the subspace, until all the memory cells of the selected subspace have been programmed to the selected logic level.

8. The method of claim 5, wherein said verifying whether all the memory cells of the selected subspace are to the selected logic level comprises selecting a group of memory cells of the selected subspace, and repeating the steps of:
verifying the logic level of the memory cells of the group;
selecting a further group of memory cells of the subspace, until all the memory cells of the selected subspace have been verified.

9. The method of claim 5, wherein said operation comprises copying the selected logic level corresponding to the memory cells of the selected subspace into the memory cells of a further selected subspace.

10. The method of claim 9, wherein said copying comprises selecting a portion of the selected subspace corresponding to a group of memory cells of the subspace, and repeating the steps of:
memorizing the logic levels corresponding to the memory cells of the group of the selected subspace into a backup register,
copying the logic levels memorized in the backup register into corresponding memory cells of the further selected subspace, and
selecting a further portion of the selected subspace,
until selected logic level of all the memory cells of the selected subspace have been copied.

11. The method of claim 5, wherein the memory cells are phase change memory cells.

12. The method of claim 5, wherein said operation comprises erasing selected memory cells of the selected subspace to the second logic level.

13. A memory, comprising:
an array of non-volatile memory cells;
a first circuit configured to dynamically partition the array into a first set of groups of memory cells, the partition corresponding to an address range, each group including at least one memory cell; and
the first circuit further configured to verify a programming state of each memory cell in the first group of memory cells.

14. The memory of claim 13 wherein the memory cells comprise phase change memory cells.

15. The memory of claim 13 wherein each of the memory cells is individually programmable.

16. The memory of claim 13 wherein each of the memory cells is individually erasable.

17. The memory of claim 13 wherein the memory cells in each group are programmable independently of the memory cells in the other groups.

18. The memory of claim 13 wherein the memory cells in each group are erasable independently of the memory cells in the other groups.

19. The memory of claim 13 wherein the first circuit is further configured to store a respective address of a first memory cell in each group of memory cells.

20. The memory of claim 13 wherein the first circuit is further configured to store a respective address of a last memory cell in each group of memory cells.

21. The memory of claim 13, further comprising a second circuit configured to perform an operation on all of the memory cells within a selected group of memory cells.

22. The memory of claim 13, further comprising a second circuit configured to compare contents of each memory cell of a group of memory cells with a respective value.

23. The memory of claim 13 further comprising a second circuit configured to copy the contents of the memory cells of one of the groups to the memory cells of another of the groups.

24. The memory of claim 13 wherein the first circuit is configured to dynamically change the partitioning of the array from the first set of groups to a second set of groups of memory cells, the second set being different from the first set.

25. A system, comprising:
a first integrated circuit, comprising:
an array of non-volatile memory cells;
a first circuit configured to dynamically partition the array into groups of memory cells, the partition corresponding to an address range, each group including at least one memory cell;

the first circuit further configured to verify a programming state of each memory cell in the first group of memory cells; and a second integrated circuit coupled to the first integrated circuit.

26. The system of claim 25 wherein the first and second integrated circuits are disposed on a same integrated circuit die.

27. The system of claim 25 wherein the first and second integrated circuits are disposed on separate integrated circuit dies.

28. The system of claim 25 wherein the second integrated circuit comprises a controller.

* * * * *